US006747453B2

(12) United States Patent
Nistler et al.

(10) Patent No.: US 6,747,453 B2
(45) Date of Patent: Jun. 8, 2004

(54) PLANAR, CIRCULAR RF ANTENNA FOR OPEN MR SYSTEMS

(75) Inventors: Juergen Nistler, Erlangen (DE); Wolfgang Renz, Erlangen (DE); Markus Vester, Nuremberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/145,313

(22) Filed: May 14, 2002

(65) Prior Publication Data

US 2002/0171589 A1 Nov. 21, 2002

(30) Foreign Application Priority Data

May 21, 2001 (DE) ........................................ 101 24 737

(51) Int. Cl.[7] ........................... G01R 33/28; G01V 3/00

(52) U.S. Cl. ....................................... 324/318; 324/322

(58) Field of Search ................................ 324/318, 322, 324/307, 309, 300; 128/653.5; 335/301, 299, 302

(56) References Cited

U.S. PATENT DOCUMENTS 5,467,017 A * 11/1995 Duerr et al. ................ 324/318
5,629,266 A * 5/1997 Lithgow et al. ............ 505/210

* cited by examiner

*Primary Examiner*—James Clinger
(74) *Attorney, Agent, or Firm*—Schiff Hardin LLP

(57) ABSTRACT

A circular, planar radio-frequency antenna for open MR devices has two spaced systems composed of planar conductors arranged on a carrier plate for currents that cross one another and that are capacitively shortened by tuning capacitors applied to ground at at least one end for tuning to the desired resonant frequency. A planar metal layer is arranged on each carrier plate, the two currents that are in turn phase-offset by 90° being supplied into the layer offset by 90°. Tuning capacitors are arranged at the feed point and at the side opposite thereto.

6 Claims, 2 Drawing Sheets

PLANAR, CIRCULAR RF ANTENNA FOR OPEN MR SYSTEMS

BACKGROUND OF THE INVENTION

1. Field of the Invention

The present invention is directed to a antenna for open MR devices having two spaced systems composed of planar conductors arranged on a carrier plate for currents that cross one another and that are capacitively shortened by tuning capacitors connected to ground at at least one end for tuning to the desired resonant frequency.

2. Description of the Prior Art

For imaging by nuclear magnetic resonance, a high-frequency, alternating magnetic field, whose frequency is dependent on the field strength of the basic field magnet, is required for exciting the spins. Typical frequencies are in the range from 8 MHz (0.2 T) through approximately 64 MHz (1.5 T).

So-called bird cage resonators are mainly used in cylindrical, i.e. closed systems. These, however, cannot be utilized in open systems such as, for example, C-shaped magnets since their conductor elements disturb the patient due to the desired openness, the openness being a desirable feature. Antennas have been specifically developed for this purpose that meet the demands of the open system, and are therefore more likely to be realized as planar structures.

Known antennas are composed, for example, of structures that a constructed like a micro-stripline that are capacitively shortened at one end or at two ends with capacitors and are thus tuned to the desired resonant frequency. In order to achieve an adequate field homogeneity, a number of such striplines are constructed next to one another and connected to one another. To construct a circularly polarized antenna, two of these arrangements that are rotated by 90° relative to one another can be employed. Due to the arrangement above one another, a coupling between the two antennas occurs (given shortening at only one end) that must be compensated with suitable coupling elements such as, for example, capacitors or coils. When the two conductor arrangements are arranged on a common, double-sided carrier plate, then high capacitive currents through the printed circuit board with corresponding losses can occur due to the coupling.

SUMMARY OF THE INVENTION

An object of the present invention is to provide a circular, planar radio-frequency antenna for open MR devices that is constructed in a simple way and exhibits only low losses.

This object is inventively in a planar radio-frequency antenna for an open MR device wherein a planar metal layer is arranged on the carrier plate of each of the two antenna systems, one carrier plate being arranged above the patient and one carrier plate being arranged under the patient, with two currents being supplied respectively into the planar metal layer offset by 90°, and with tuning capacitors arranged at the feed point and at the opposite side. Only one such metal layer is present on each carrier plate. A single metal layer is present on each carrier plate.

The arrangement is preferably constructed such that two tuning capacitors on each side the feed point are provided.

The invention is based on the principle that two currents that flow exactly perpendicular relative to one another are ideally decoupled, and this is also true when the currents flow in the same plane. When the structure is completely symmetrical, then current can be supplied at two sides offset by 90° relative to one another without having the systems influence one another. When, as usual, the currents are phase-offset by 90° relative to one another, a circularly polarized magnetic field is generated as a result. Since an ideally symmetrical structure cannot be realized in practice, a certain, slight coupling of the systems nonetheless occurs, but this can be compensated in a very simple way by means of the tuning capacitors arranged at both sides of the feed points, since the capacitance can, so to speak, be shifted back and forth between these flanking tuning capacitors.

Particularly as an adaptation to the spherical homogeneity volume of the basic field magnet, it has proven expedient to employ a circular conductor arrangement, i.e. a circular metal layer, in addition to a quadratic metal layer. This provides an adaptation to the rest of the geometry since, of course, the gradient coil also is usually circular. The electrical advantage that is thereby gained is that the tuning capacitors in this arrangement can be uniformly arranged around the circumference of the metal layer. A steady change of the potential on the conductor is achieved as a result, thereby homogenizing the generated field.

In an embodiment of the invention, the antenna is optimized by connecting a low-loss dielectric material between the circular metal layer and the ground surface instead of the discrete capacitors. In this embodiment as well, tuning capacitors that flank the feed point of the currents are additionally needed.

In order to obtain an approximately uniform field having a diameter of, for example 40 cm with such an antenna, the diameter of the arrangement must lie on approximately the same order of magnitude. An increase of the B-field in the middle directly above the metal layer occurs compared to the B-field at the edge of the metal layer, which degrades the desired homogeneity. An improvement can be achieved in an embodiment of the invention wherein a central, circular recess is provided in the middle of the metal layer, the field being able to proceed therethrough. The field thus is attenuated in the middle region, so that a more uniform field course is achieved overall.

DESCRIPTION OF THE PREFERRED EMBODIMENTS

Figure 1:
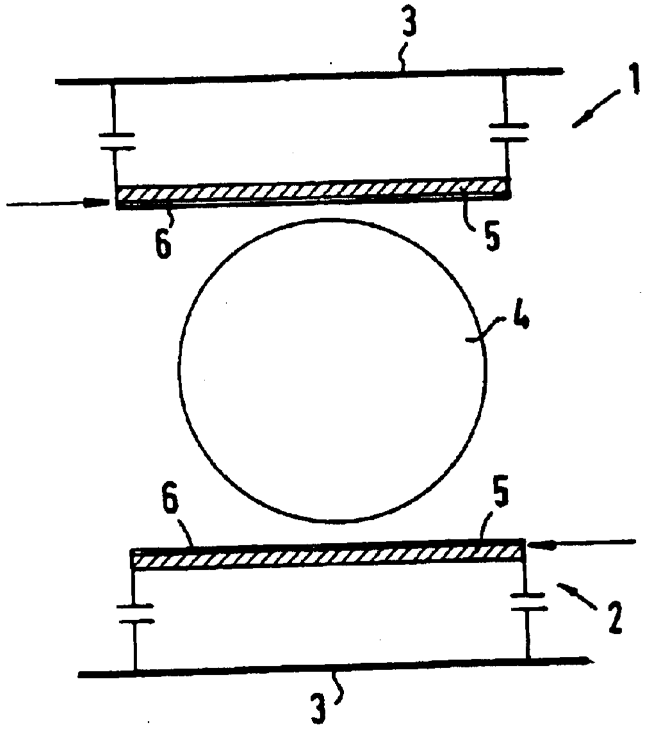
FIG. 1 is a section through an inventive, circular planar radio-frequency antenna composed of two spaced antenna systems.
Figure 2:
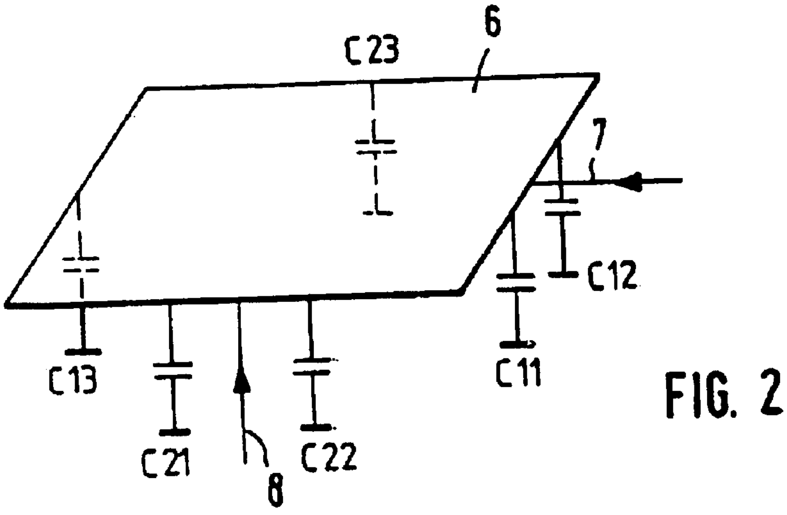
FIG. 2 is a schematic view of an antenna system without the ground surface.

The inventive antenna shown in FIG. 1 is composed of an upper antenna system 1 and a lower antenna system 2 that, for example, are secured to the gradient coils of an open MR apparatus. The respective ground surface 3 lies on the gradient coil or is formed by the metallic surface thereof. The homogeneity region of the antenna is indicated at 4. Each of the antenna systems has a metal layer 6, for example a solid copper plate, applied on a carrier plate 5 that is connected to the ground surface 3 via capacitors. Current feed points 7 and 8 are offset by 90° relative to one another for the two currents phases offset by 90°. A circularly polarized magnetic field thus is achieved.

Whereas only single capacitors C13, C23 are provided at the points of the metal layer 6 lying opposite the feed points 7 and 8, pairs of capacitors C11, C12 and C21, C22 flanking the feed points are present at the feed points 7 and 8. This allows the possibility for the capacitances to be shifted back and forth between the capacitor pairs and a balancing of the structure, that can never be exactly symmetrical in practice. Such a balancing is needed so that no coupling of the two current delivery systems occurs. Only by this means can the inventive structure be realized. Two separate conductor systems that cross one another are not required, in contrast to known antenna structures.

Figure 3:
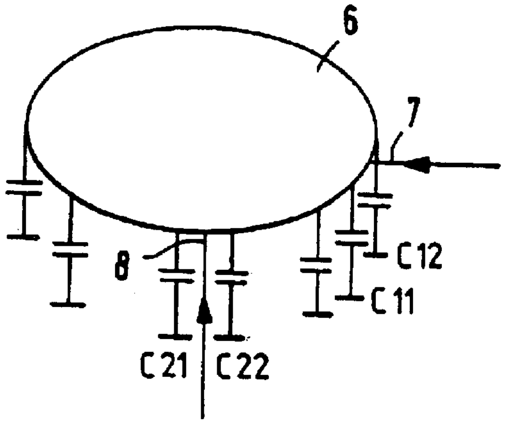
FIG. 3 is a view corresponding to FIG. 2 of an antenna system with a circular conductor surface.

FIG. 3 shows a modified structure wherein the metal layer 6 is circular, so that the capacitors can be uniformly arranged around the circumference. In this uniformly distributed arrangement, however, it must be taken into consideration that two pairs of flanking tuning capacitors are again required for balancing at the feed points 7 and 8 for the 0° system, and the 90° system.

Figure 4:
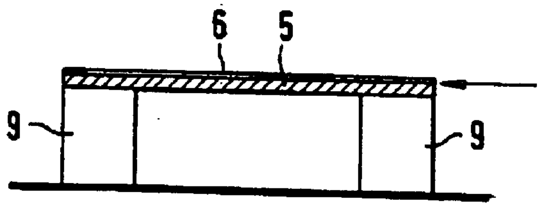
FIG. 4 is a section through an arrangement wherein the tuning capacitors are partially replaced by a dielectric between the printed circuit board and ground.

The schematic section through an antenna half according to FIG. 4 shows an arrangement wherein some of the capacitors are replaced by a dielectric 9, but these are not the tuning capacitors C11, C12 or C21, C22. A low-loss dielectric is employed.

Figure 5:
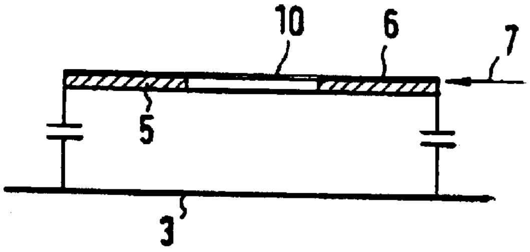
FIG. 5 is a section through an antenna arrangement with a central recess of the metal layer.
Figure 6:
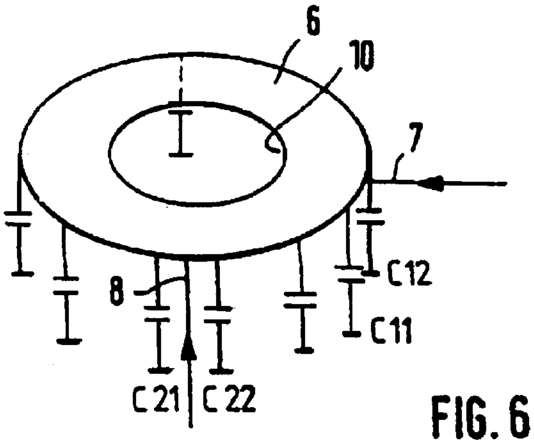
FIG. 6 is a view of the antenna arrangement of FIG. 5 without the ground surface.

Again without the ground surface, FIGS. 5 and 6 show a cross-section and a front view of an arrangement with circular conductors, i.e. a circular metal layer 6. This metal layer 6 is additionally provided with a central recess 10 in order to achieve a more uniform magnetic field course over the surface of the antenna.

Although modifications and changes may be suggested by those skilled in the art, it is the intention of the inventor to embody within the patent warranted hereon all changes and modifications as reasonably and properly come within the scope of his contribution to the art.

We claim as our invention:

1. A circular, planar radio-frequency antenna for an open MR apparatus, comprising:

a first carrier plate and a second carrier plate spaced from each other;

each of said carrier plates having a planar metal layer disposed thereon forming a planar conductor for two 90° phase-offset currents respectively supplied to said planar metal layer at respective feed points separated by an angle of 90°, each of said planar metal layers having a periphery; and the planar metal layers on the respective first and second carrier plates each having a plurality of tuning capacitors connected thereto and connected to ground, with tuning capacitors at each planar metal layer being connected at the respective feed points and at points of said planar metal layer respectively opposite said feed points, and said tuning capacitors being connected at equally spaced points around said periphery.

2. A radio-frequency antenna as claimed in claim 1 wherein, at each of said feed points, two of said tuning capacitors are connected on opposite sides of the feed point.

3. A radio-frequency antenna as claimed in claim 1 wherein said planar metal layer has a quadratic shape.

4. A radio-frequency antenna as claimed in claim 1 wherein said planar metal layer has a circular shape.

5. A radio-frequency antenna as claimed in claim 4 wherein said planar metal layer has a central, circular recess.

6. A radio-frequency antenna as claimed in claim 1 wherein at least some of said tuning capacitors are formed by a low-loss dielectric connected between said metal layer and ground.

* * * * *